(12) United States Patent
Lappalainen

(10) Patent No.: US 6,452,394 B1
(45) Date of Patent: Sep. 17, 2002

(54) TRANSFER OF THE RESONANCE FREQUENCY OF THE RESONANCE CIRCUIT BY EXTRA RF FREQUENCY COMBINED WITH THE EXCITATION RF PULSE

(75) Inventor: Aatu Veikko Kalevi Lappalainen, Helsinki (FI)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/693,362

(22) Filed: Oct. 20, 2000

(51) Int. Cl.[7] .................................. C01V 3/00
(52) U.S. Cl. .................. 324/318; 324/322; 324/307
(58) Field of Search .................. 324/322, 318, 324/309, 307; 128/653

(56) References Cited

U.S. PATENT DOCUMENTS

| | | | |
|---|---|---|---|
| 4,725,779 A | 2/1988 | Hyde et al. | 324/318 |
| 4,793,356 A | 12/1988 | Misic et al. | 128/653 |
| 5,256,972 A | 10/1993 | Keren et al. | 324/318 |
| 5,869,966 A * | 2/1999 | Gatehouse | 324/322 |
| 6,144,205 A * | 11/2000 | Souza et al. | 324/322 |

* cited by examiner

Primary Examiner—Edward Lefkowitz
Assistant Examiner—Brij B. Shrivastav
(74) Attorney, Agent, or Firm—Fay, Sharpe, Fagan, Minnich & McKee, LLP

(57) ABSTRACT

A main magnetic field ($B_0$) is applied through an imaging region (10). High power RF excitation or manipulation electrical pulses (56) are applied to transmit coils (30), (30'). The transmit coil is inherently tuned to a frequency that is different from the resonance frequency of dipoles in the imaging region that are to be resonated. The transmit coil includes a reactive element ($C_t$) which is switched in and out of electrical communication with other inductive and capacitive portions (L), ($C_0$) of the transmit coil to change its tuning between the resonance and off-resonance frequencies. A rectifying diode ($v_2$) and a resistor are connected in parallel with the PIN diode ($v_1$) to rectify RF signals and generate a D.C. voltage across the resistor which biases the PIN diode to its conductive state. Preferably, before an RF excitation or manipulation electrical pulse is sent to the transmit coils, a tuning synthesizer (60) generates an off-resonance radio frequency pulse which is applied to the transmit coil, causing the rectifying diode and resistor to bias the PIN diode conductive, hence retune the transmit coil to the resonance frequency by the time the resonance frequency excitation or manipulation electrical signal is applied. After the radio frequency excitation or manipulation pulse is terminated, the PIN diode ($V_1$) switches non-conductive detuning through transmit coil. When the transmit coil is detuned, it does not interfere with a receive only coil (50) as it receives resonance signals from the resonating dipoles in the imaging region.

12 Claims, 2 Drawing Sheets

TRANSFER OF THE RESONANCE FREQUENCY OF THE RESONANCE CIRCUIT BY EXTRA RF FREQUENCY COMBINED WITH THE EXCITATION RF PULSE

BACKGROUND OF THE INVENTION

The present invention relates to radio frequency (RF) receive coils and magnetic resonance scanners incorporating them. The invention finds particular application in isolating or detuning an RF excitation coil during portions of an imaging process in which it does not participate. It is to be appreciated however, that the present invention may find further application in isolating individual coil portions of a single coil, isolating reserve coils during excitation, selected among plural coil resonance frequencies, or in other arts in which selective RF signal reception is practiced.

Magnetic resonance imaging (MRI) machines apply a main magnetic field through an examination region. This strong field, typically denoted $B_0$, acts to align the nuclei within a subject to be examined. In some MRI machines, the $B_0$ field is horizontally oriented, and in others it is vertically oriented.

In both horizontally and vertically oriented systems, magnetic resonance is excited in the aligned nuclei by a relatively strong orthogonal RF field, typically denoted $B_1$. The $B_1$ field causes the aligned nuclei or spins to tip into an plane orthogonal to the static magnetic field $B_0$. Over time, the spins realign themselves with the $B_0$ field emitting relatively weak radio frequency (RF) resonance signals as they precess. This resonance is detected by RF coils tuned to the specific resonance frequency desired. These resonance signals are passed to image processing equipment to reconstruct the signals into an image representation for display on a video monitor.

The transmitted excitation RF pulses and the received resonance signals are in the same, limited frequency spectrum. Hence, the same coil is often used for both transmission and reception. However, in some applications, it is advantageous to have separate transmit and receive coils. When two coils in the same system are tuned to the same frequency, they tend to couple and otherwise interact detrimentally.

Typically, the transmit RF signals are orders of magnitude larger than the magnetic resonance signals generated by the excited nuclei and detected by the RF receive coils. To ensure optimum receiving conditions, the transmit coil is typically detuned during the reception mode. This eliminates the loss of RF resonance power to the transmit coil during receiving. This lessens the chance of noise reception in the form of gradient pulse energy retransmission by the transmit coil in the resonance frequency spectrum. Accordingly, it is advantageous to desensitize the transmit coil to the Larmor frequency of the resonating dipoles so it does not negatively affect the receive process.

Typically, the resonance frequency of the transmit coil is changed by connecting one or more capacitors in parallel to or in series with the coil through a PIN diode or diodes. The PIN diodes are controlled by a DC bias applied by separate control electronics and control cables. When the PIN diode is set to conduct by release current, the series connected capacitor becomes electrically connected as part of the coil circuit. When the direct current is switched off, the resistance of the PIN diode grows high enough to electrically disconnect its series connected capacitor from the coil circuit. Control cables for the PIN diodes act as RF antennas and conductors carrying stray resonance frequency RF signals into the system. A lowpass filter is used to lock the RF resonance frequency in each of the control cables. The separate PIN diode control electronics, DC biasing potentials, and cabling impose restrictions on the design and shape of the transmit coil, as well as restrictions on the placement of PIN diodes in the coil structure.

The present invention contemplates an improved method and apparatus to detune a transmit coil which overcomes the above-referenced problems and others.

SUMMARY OF THE INVENTION

According to one aspect of the present invention, a magnetic resonance imaging apparatus is provided. Gradient coils spatially encode a main magnetic field generated by the apparatus. Radio frequency transmit coils transmit RF pulses as directed by an RF transmitter, an RF control processor, and a tuning synthesizer into an imaging region exciting and manipulating magnetic dipoles therein. The transmit coils include tuning circuits which shift the resonance frequency of the coils when activated. At least one radio frequency receive coil receives magnetic resonance signals, which are demodulated by one or more receivers, and reconstructed by a reconstruction processor.

According to a more limited aspect of the present invention, the tuning circuit includes a tuning capacitor, a biasing power supply, and a circuit element, the circuit element including a PIN diode, and the biasing power supply including a resistance and a rectifying diode.

According to another aspect of the present invention, an RF transmit coil is given. The RF transmit coil contains conductive, inductive, capacitive, and reactive elements that tune the RF transmit coil.

According to another aspect of the present invention, a method of magnetic resonance imaging is given. A main magnetic field is generated in an imaging region and spatially encoded. Magnetic resonance is excited and manipulated with an RF transmit coil, and received with an RF receive coil and demodulated. The RF transmit coil is detuned while the magnetic resonance signals are being received.

According to another aspect of the present invention, a detuning circuit is given. The detuning circuit uses PIN diodes and capacitances to change the resonance frequency of an RF transmit coil.

One advantage of the present invention resides in the ability to detune an RF transmit coil during a receive phase of a magnetic resonance imaging event.

Another advantage of the present invention is that it requires no added hardware.

Another advantage of the present invention is that it allows for the elimination of selected cabling and circuitry from a typical MR system while maintaining the integrity of the system.

Another advantage of the present invention is that it reduces imaging artifacts.

Another advantage of the present invention is that it grants greater freedom for transmit coil designs.

Yet another advantage of the present invention is that it minimizes power loss from the resonance signals.

Still further advantages of the present invention will become apparent to those of ordinary skill in the art upon reading and understanding the following detailed description of the preferred embodiments.

BRIEF DESCRIPTION OF THE DRAWINGS

The invention may take physical form in certain parts and arrangements of parts, and in certain steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
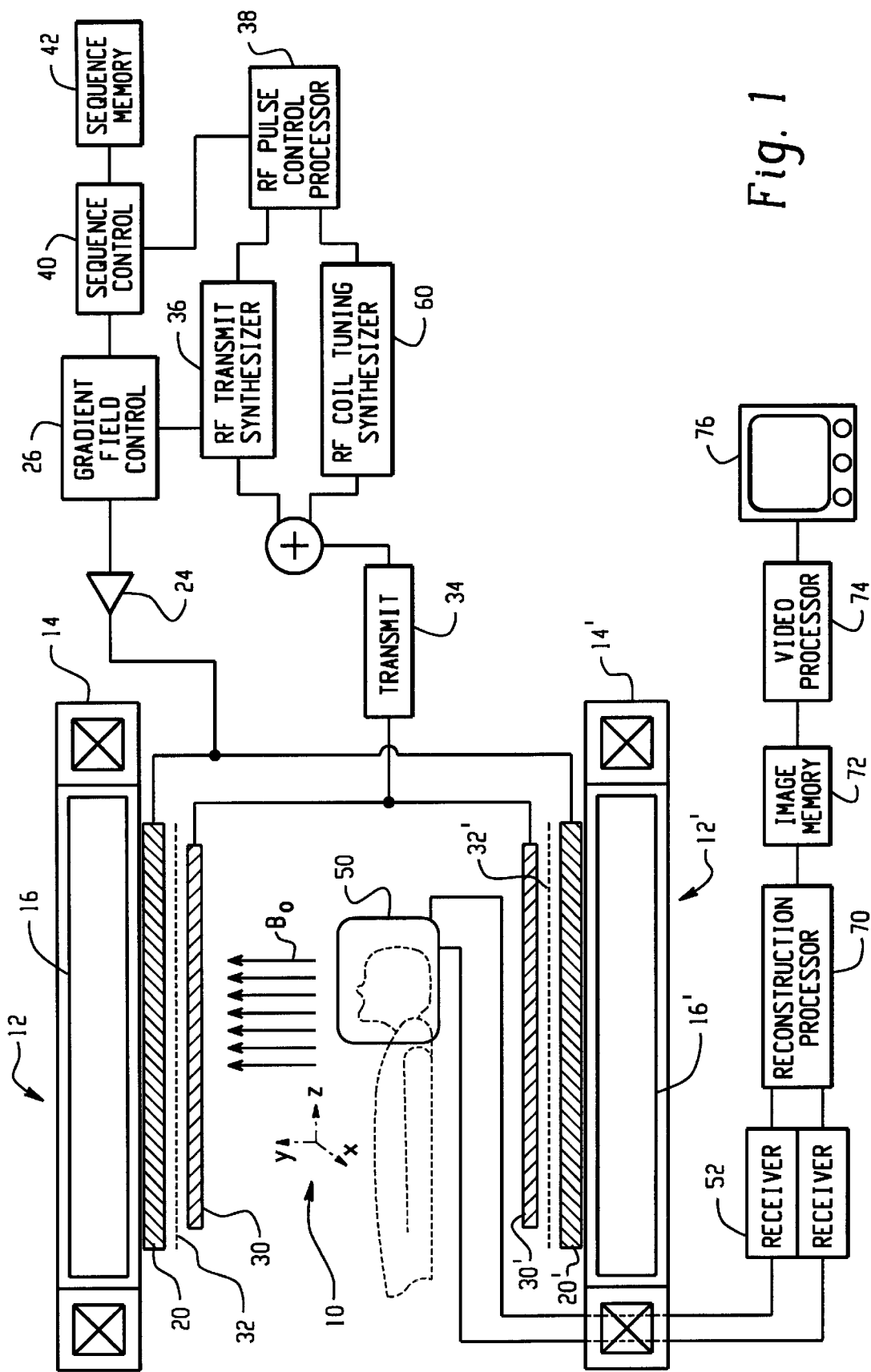
FIG. 1 is a diagrammatic illustration of a magnetic resonance imaging apparatus in accordance with the present invention.

With reference to FIG. 1, in an open MRI system, an imaging region 10 is defined between an upper pole assembly 12 and a like lower pole assembly 12'. A pair of annular super-conducting magnets 14, 14' surround upper and lower pole pieces 16, 16' generating a temporally constant, main magnetic field $B_0$ through the imaging region 10. It is to be appreciated that the open MRI apparatus may have a variety of pole piece constructions or, in some instances, no pole pieces at all. The magnets for generating the main magnetic field can be positioned at other locations. optionally, a ferrous flux return path is provided between the pole assemblies remote from the imaging region 10.

For imaging, magnetic field gradient coils 20, 20' are disposed on opposite sides of the imaging region 10 adjacent the pole pieces 16, 16'. In the preferred embodiment, the gradient coils 20, 20' are planar coil constructions which are connected by gradient amplifiers 24 which are controlled by a gradient magnetic field controller 26. The gradient magnetic field controller 26 causes current pulses which are applied to the gradient coils 20, 20' such that gradient magnetic fields are superimposed on the temporally constant and uniform field $B_0$ across the imaging region 10. The gradient fields are typically generated along a longitudinal or z-axis, a vertical or y-axis and a transverse or x-axis.

For exciting and manipulating magnetic resonance in selected dipoles, radio frequency transmit coils 30, 30' are disposed between the gradient coils 20, 20', respectively, and the imaging region 10. RF screens 32, 32' are disposed between the RF coils 30, 30' and the gradient coils 20, 20' to minimize the generation of RF eddy currents in the gradient coils 20, 20'. The RF transmit coils 30, 30' transmit RF pulses into the imaging region. One or more RF transmitter 34 is connected to the RF transmit coils to supply resonance excitation RF pulses. An RF transmit synthesizer 36 is controlled by an RF pulse control processor 38 to synthesize preselected pulse shapes for exciting and manipulating magnetic resonances. A sequence controller 40 coordinates the gradient field pulses and the RF pulses to implement a selected MR imaging sequence. The sequence controller accesses a sequence memory 42 which stores a plurality of preprogrammed imaging sequences from among which the operator selects.

Various RF pulses are synthesized, as are appropriate to the selected imaging sequence. Typical synthesized RF pulses include low tip angle (e.g. 7°–15°) excitation pulses, 90° tip pulses, 180° shift pulses, and others as are known in the art. Various types of pulses are often synthesized at different points in the imaging sequence.

A receive coil 50, such as head coil or other localized coil, receives the resonance signals, which are conveyed to one or more receivers 52. Preferably, the receive coil 50 is a quadrature coil and quadrature channel is connected to its own receiver. After the transmit coils 30, 30' have transmitted each excitation or manipulation pulse, they are detuned during reception of the resonance signal. One reason for detuning the transmit coils is that the magnetic resonance signals are typically much weaker then the transmitted RF pulses. It is desirable not to waste any of the power resonating the transmit coils. Another reason for detuning the transmit coils 30, 30' is so they do not couple with the receive coil 50.

Figure 2:
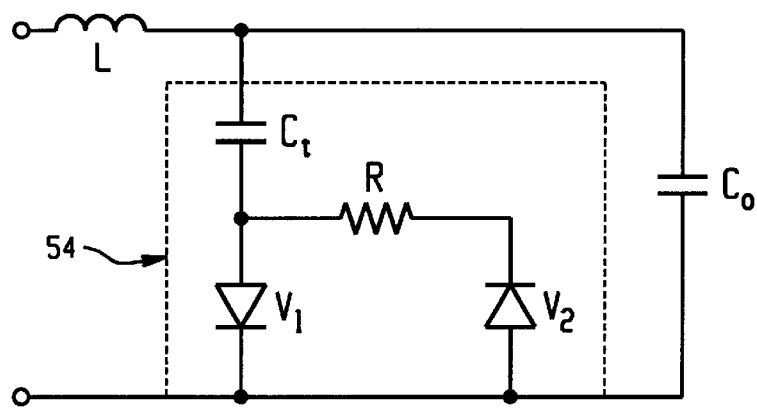
FIG. 2 is a cut-away of pertinent circuit elements.

With reference to FIG. 2 and continuing reference to FIG. 1, the transmit coils 30, 30' are tuned off-resonance, i.e. are inherently detuned. Each channel of the transmit coils includes a detuning circuit 54 which shifts the resonance frequency of the transmit coil. The resonance frequency of each channel of the transmit coil, while tuned, is determined by the coil's natural inductance L, an initial capacitance $C_o$ and a tuning capacitance $C_t$.

Figure 3:
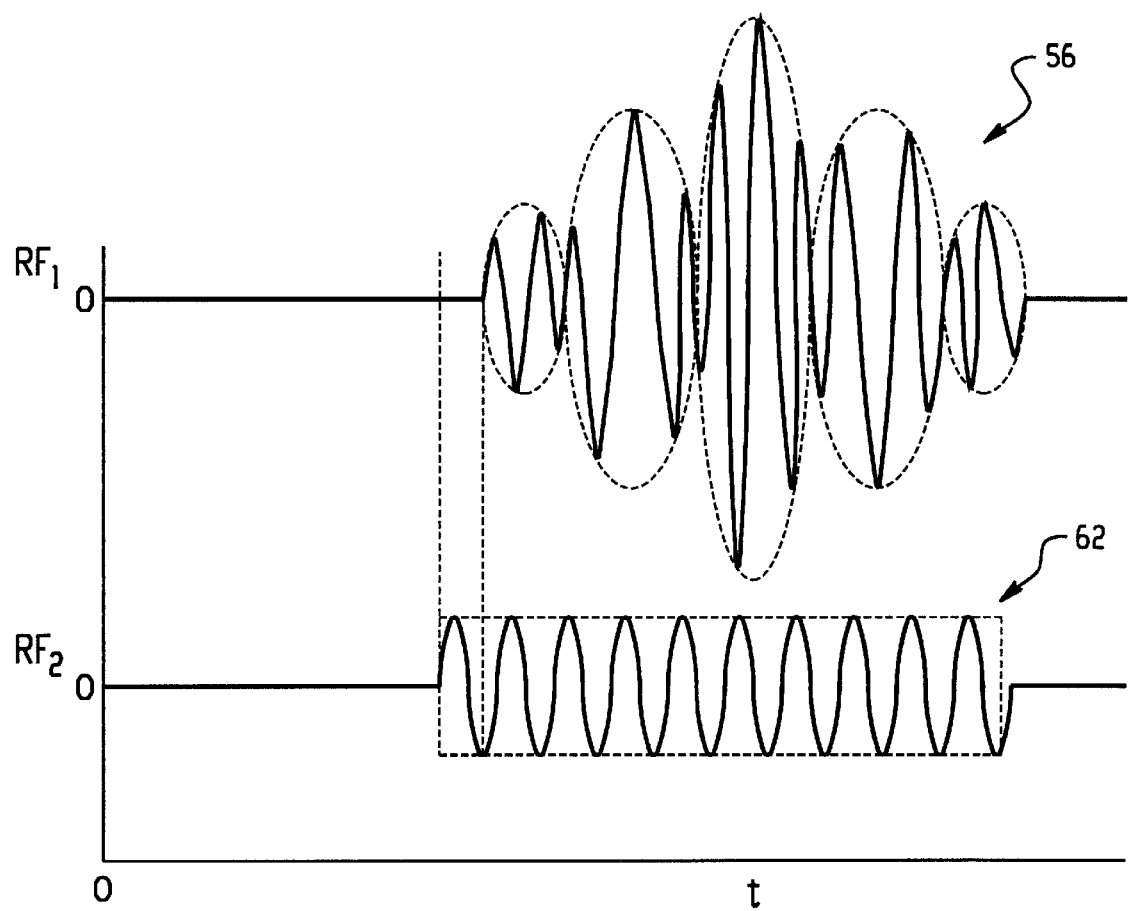
FIG. 3 is a diagrammatic illustration of an RF resonance excitation or manipulation pulse and an off-resonance tuning pulse.

While in a non-transmit mode, a PIN diode $V_1$ is non-conductive so the circuit does not see the detuning capacitance $C_t$. The channel is thus detuned from resonance to a detuned frequency. With reference to FIG. 3, preparation for a transmission pulse 56, a tuning synthesizer 60 creates a tuning pulse 62 at the detuned frequency. When the tuning pulse is applied a rectifying diode $V_2$ which rectifies the tuning pulse creating a biasing voltage across a resistor R. Applying the D.C. voltage across the diode $V_1$ turns it conductive, thus adding the capacitance $C_t$ to the circuit. As a result of this action, the resonance frequency is no longer defined by L and $C_o$, rather it is defined by L, $C_o$, and $C_t$. The RF transmission pulse 56 preferably lags the tuning pulse 62 by a duration commensurate with the time needed to bias the diode $V_2$ conductive. Once the RF transmission pulse commences, the tuning pulse can be turned off on the biasing potential derived from the transmission pulse. Once the RF transmission and tuning pulses turn off, the biasing voltage is lost and the tuning capacitor $C_t$ is electrically removed from the circuit. In this manner, the coil quickly reverts to its detuned state.

The RF pulse that is sent to bias the diode $V_1$ is preferably not at the resonance frequency. A frequency is chosen that does not excite unwanted resonance in the imaging region. This is beneficial because a pulse can be sent to detune the transmit coil after the dipoles have been excited without adversely affecting the imaging process. Alternately, the transmit pulse itself can bias the diode $V_1$ conductive. When using the transmit pulse, its leading edge is preferably adjusted to minimize any distortion in the resultant magnetization tipping or manipulation during the period before diode $V_1$ switches to its conductive state.

By using RF power to bias the diodes, a separate source and dedicated cables are eliminated. Typically, an MRI system has several frequency synthesis channels dedicated to exciting the imaging target. These channels are seldom all used simultaneously. Utilizing the dormant channels at any given time gives more utility to the RF equipment. That is, the machine as a whole becomes more efficient.

With continuing reference to FIG. 1, the induced magnetic resonance signals are detected by the RF receive coil 50 and demodulated by the receivers 52. The received resonance signals are passed to a reconstruction processor 70 which reconstructs them into a volumetric or other electronic image representation of the imaging region. The volumetric image representation is stored in an image memory 72. A video processor 74 processes operator selected portions of the volumetric electronic image representation to transform portions of it into a suitable form for display on a human readable display 76 such as a video monitor, liquid crystal display, active matrix monitor, or the like.

Alternately, the transmit coil can be tuned to the resonance frequency with the tuning capacitor $C_t$ electrically connected with it. The PIN diode $V_1$ can be connected in parallel to the tuning capacitor and connected with the D.C. voltage from the rectifying capacitor $V_2$ and the resistor R such that the PIN diode becomes a short circuit in the presence of an RF signal. By creating a short circuit around the tuning capacitor $C_t$, the tuning capacitor is effectively removed from the circuit, and the frequency of the coil is controlled by inductor L and initial capacitor $C_o$ to the off resonance frequency.

The invention has been described with reference to the preferred embodiments. Modifications and alterations will naturally occur to others upon reading and understanding the preceding detailed description. For example, artisans will appreciate that the invention can be utilized to alternate between modes in a coil supportive of more than one mode, for example a quadrature coil. It is intended that the invention be construed as including all such modifications and alterations insofar as the come within the scope of the appended claims, or the equivalents thereof.

Having thus described the preferred embodiment, the invention is now claimed to be:

1. A magnetic resonance imaging apparatus in which a main magnetic field through an imaging region sets a resonance frequency of dipoles in the imaging region, the apparatus comprising:

at least one radio frequency transmit coil which selectively transmits RF pulses into the imaging region during an RF transmit phase, the at least one radio frequency transmitter coil being tuned to a first frequency that is different from the resonance frequency;

the transmit coil including a tuning circuit which shifts a tuned frequency of the transmit coil between the resonance frequency during the transmit phase and the first frequency, during an RF receive phase;

at least one radio frequency receive coil tuned to the resonance frequency to detect magnetic resonance signals from resonating dipoles of a subject located in the imaging region;

a gradient coil assembly which spatially encodes resonating dipoles in the imaging region with magnetic field gradients superimposed on the main magnetic field;

at least one receiver which demodulates the received resonance signals from the at least one radio frequency receive coil; and, a reconstruction processor which reconstructs the received resonance signals into electronic image representation.

2. A magnetic resonance imaging apparatus comprising:

at least one radio frequency transmit coil which selectively transmits RF pulses into the imaging region during an RF transmit phase, the transmit coil being tuned to one of a preselected resonance frequency and a selected detuned frequency, a tuning circuit which shifts tuning of the transmit coil between the preselected resonance frequency during the transmit phase and the selected detuned frequency, during an RF receive phase, the tuning circuit including:

a tuning capacitor which in combination with the inductance of the transmit coil tunes the transmit coil to the other of the preselected resonance frequency and the selected detuned frequency;

a circuit element that is powered by RF signals to switch the tuning capacitor in and out of electrical communication with the transmission coil.

3. The magnetic resonance imaging apparatus as set forth in claim 2, wherein the circuit element includes a PIN diode and further including:

a biasing power supply which converts RF signals into a DC bias voltage which biases the PIN diode conductive.

4. The magnetic resonance imaging apparatus as set forth in claim 3, wherein the biasing power supply includes:

a series connected rectifying diode and a resistance.

5. A magnetic resonance imaging apparatus in which a main magnetic field is generated in an imaging region, the apparatus comprising:

at least one radio frequency transmit coil which selectively transmits RF pulses into the imaging region during an RF transmit phase, the transmit coil including a tuning circuit which shifts tuning of the transmit coil between a preselected resonance frequency during the transmit phase and a detuned frequency, during an RF receive phase, wherein the tuning circuit includes:

a series connected rectifying diode and resistance connected in parallel with a PIN diode to form a parallel arrangement which converts RF signals into a DC biasing voltage which biases the PIN diode conductive; and, a tuning capacitor connected in series with the parallel arrangement, the tuning capacitor and parallel arrangement being connected with the transmit coil to switch the tuning capacitor in and out of electrical communication with the transmission coil;

at least one radio frequency receive coil tuned to the preselected resonance frequency to detect magnetic resonance signals from resonating dipoles of a subject located in the imaging region;

a gradient coil assembly which spatially encodes the imaging region with magnetic field gradients superimposed on the main magnetic field;

at least one receiver which demodulates the magnetic resonance signals from the at least one radio frequency receive coil;

a reconstruction processor which reconstructs the received magnetic resonance signals into electronic image representation.

6. A magnetic resonance imaging apparatus comprising:

an RF transmit synthesizer which synthesizes RF transmit pulses at a preselected resonance frequency;

a transmitter which amplifies the RF transmit pulses and supplies amplified RF transmit pulses;

at least one radio frequency transmit coil which receives the amplified RF transmit pulses and transmits the RF pulses into the imaging region during an RF transmit phase, the transmit coil including a tuning circuit which shifts tuning of the transmit coil between the preselected resonance frequency during the transmit phase and a detuned frequency, during an RF receive phase;

at least one radio frequency receive coil tuned to the preselected resonance frequency to detect magnetic resonance signals during the receive phase from resonating dipoles of a subject located in the imaging region;

a gradient coil assembly which spatially encodes the imaging region with magnetic field gradients superimposed on the main magnetic field;

at least one receiver which demodulates the magnetic resonance signals from the at least one radio frequency receive coil;

a reconstruction processor which reconstructs the received magnetic resonance signals into electronic image representation.

7. The magnetic resonance apparatus as set forth in claim 6, further including:

a tuning synthesizer which synthesizes RF pulses as a different frequency which is shifted from the preselected resonance frequency, the transmitter amplifying the different frequency pulse and supplying it to the RF transmit coil.

8. The magnetic resonance imaging apparatus as set forth in claim 7, further including:

an RF pulse control processor which coordinates the RF transmit and tuning synthesizers such that the different frequency pulse is supplied to the transmit coil sufficiently in advance of the transmit pulse such that the transmit coil is tuned to the preselected resonance frequency when the transmit pulse is supplied to the transmit coil.

9. An RF transmit coil for a magnetic resonance imaging apparatus, the transmit coil comprising:

electrically conductive, inductive, and capacitive coil means, which is tuned to an off-resonance frequency that is shifted from a resonance frequency of imaged dipoles;

a reactive element means which retunes the coil means from the off-resonance frequencies to the resonance frequency of the imaged dipoles;

a tuning means activated by RF pulses from the coil means for switching the reactive element means into electrical communication with the coil means returning the coil means to the imaged dipole resonance frequency in an activated state and detuning the coil means to the off-resonance frequency in a deactivated state.

10. An RF transmit coil comprising:

electrically connected conductive, inductive and capacitive elements, which have a first resonance frequency that is offset from a resonance frequency of imaged dipoles;

a tuning circuit including:

a power supply which converts received RF pulses into DC power; and, a switch whose state is changed by the DC power to switch a reactive element in and out of electrical communication with the inductive and capacitive elements when the reactive element is in electrical communication with the inductive and capacitive elements, the inductive and capacitive elements and the reactive element have a second resonance frequency that matches the imaged dipole resonance frequency.

11. A method of magnetic resonance imaging including:

generating a main magnetic field in an imaging region thereby aligning dipoles of a subject disposed in the imaging region;

spatially encoding the main magnetic field with a gradient field;

applying resonance frequency pulses to an RF transmit coil which is tuned to an off-resonance frequency;

converting a portion of energy from the resonance frequency pulses into a DC bias which powers a means for returning the RF transmit coil to the resonance frequency, such that the RF transmit coil resonates at the resonance frequency exciting and manipulating resonance in the aligned dipoles of the subject;

in the absence of the applied resonance frequency pulses, detuning the RF transmit coil back to the off-resonance frequency such that the RF transmit coil is insensitive to the resonance excited in the dipoles of the subject;

receiving magnetic resonance signals with an RF receive coil that is tuned to the resonance frequency; and, demodulating and processing the magnetic resonance signals into a volumetric representation of the subject within the imaging region.

12. The method as set forth in claim 11, wherein detuning the RF transmit coil comprises adding an extra capacitance to a circuit which defines a resonance frequency of the RF transmit coil, thereby changing the total capacitance of the circuit, and the resonance frequency of the RF transmit coil.

* * * * *